US010782360B2

(12) United States Patent  
Pamulaparthy et al.

(10) Patent No.: US 10,782,360 B2  
(45) Date of Patent: Sep. 22, 2020

(54) SYSTEMS AND METHODS FOR MONITORING AND DIAGNOSING TRANSFORMER HEALTH

(71) Applicant: General Electric Company, Schenectady, NY (US)

(72) Inventors: Balakrishna Pamulaparthy, Hyderabad (IN); Vijayasarathi Muthukrishnan, Markham (CA); Lubomir Sevov, Markham (CA); Balamourougan Vinayagam, Markham (CA)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/399,392

(22) Filed: Jan. 5, 2017

(65) Prior Publication Data

US 2017/0115335 A1 Apr. 27, 2017

Related U.S. Application Data

(63) Continuation of application No. 14/703,533, filed on May 4, 2015, now abandoned.

(51) Int. Cl.
*G01R 31/62* (2020.01)
*H02H 7/04* (2006.01)
*G01R 31/50* (2020.01)

(52) U.S. Cl.
CPC ............. *G01R 31/62* (2020.01); *G01R 31/50* (2020.01); *H02H 7/04* (2013.01)

(58) Field of Classification Search
CPC .. G01R 31/024; G01R 31/025; G01R 31/026; G01R 31/027; G01R 31/62; G01R 31/50; G01R 31/52; H02H 7/04
See application file for complete search history.

(56) References Cited

U.S. PATENT DOCUMENTS 3,955,138 A * 5/1976 Milkovic ............. G01R 21/127  
324/107  
4,156,884 A * 5/1979 Eckart ..................... H02H 3/162  
361/46

(Continued)

FOREIGN PATENT DOCUMENTS

CN 101587155 A 11/2009  
CN 201393051 Y * 1/2010

(Continued)

OTHER PUBLICATIONS

Basler Electric. "Increasing Power Transformer Life Using Through-Fault-Monitoring and Thermal Management", IEEE Application Notes: Published for the Basler Electric Power Systems Group, #PC-11T, 2012.

(Continued)

*Primary Examiner* — Michele Fan  
(74) *Attorney, Agent, or Firm* — Eversheds Sutherland (US) LLP

(57) ABSTRACT

Embodiments of the disclosure relate to systems and methods for monitoring and diagnosing transformer health. In one embodiment, a system incorporating a diagnostic apparatus for monitoring a power transformer can be provided. Various electrical current sensing elements and a dissolved gas analysis (DGA) apparatus are coupled to the transformer and to the diagnostic apparatus. The diagnostic apparatus can be configured to detect a through-fault in the transformer by executing an electrical current flow analysis based at least in part on electrical current values received from the electrical current sensing elements. The electrical current flow analysis involves comparing a ratio of a differential electrical current value and a restraining electrical current value to a threshold value. The diagnostic apparatus can also use DGA data provided by the DGA apparatus to detect an abnormal gas-related condition in the transformer. A trans- (Continued)

former health related signal and/or a control signal that is based on the transformer health data, can be transmitted by the diagnostic apparatus.

20 Claims, 4 Drawing Sheets

(56) References Cited

U.S. PATENT DOCUMENTS

| | | | | |
|---|---|---|---|---|
| 4,689,710 A * | 8/1987 | Anzai | ............... | H02H 3/283 |
| | | | | 361/87 |
| 5,305,174 A * | 4/1994 | Morita | ............... | H02H 3/025 |
| | | | | 361/58 |
| 5,808,844 A * | 9/1998 | Schiel | ............... | H02H 3/283 |
| | | | | 361/36 |
| 8,031,447 B2 | 10/2011 | Guzman-Casillas et al. | | |
| 2002/0161485 A1 * | 10/2002 | Mahnert | ............... | H02H 3/283 |
| | | | | 700/293 |
| 2006/0164096 A1 * | 7/2006 | Kwon | ............... | G01R 19/04 |
| | | | | 324/522 |
| 2008/0106425 A1 * | 5/2008 | Deaver | ............... | G01R 19/16547 |
| | | | | 340/646 |
| 2009/0009351 A1 * | 1/2009 | Lamontagne | ............... | H02H 5/08 |
| | | | | 340/646 |
| 2009/0043538 A1 * | 2/2009 | Lamontagne | ............... | H01F 27/402 |
| | | | | 702/183 |
| 2009/0091867 A1 | 4/2009 | Guzman-Casillas et al. | | |
| 2009/0187344 A1 | 7/2009 | Brancaccio et al. | | |
| 2011/0063761 A1 * | 3/2011 | Kasztenny | ............... | H02H 7/045 |
| | | | | 361/36 |
| 2014/0002937 A1 * | 1/2014 | Tausa | ............... | H02H 3/343 |
| | | | | 361/76 |
| 2014/0095087 A1 * | 4/2014 | Bejmert | ............... | H02H 1/0092 |
| | | | | 702/58 |
| 2015/0127277 A1 * | 5/2015 | Desai | ............... | G01N 33/26 |
| | | | | 702/58 |
| 2016/0202303 A1 * | 7/2016 | Costa i Bricha | ...... | G01R 31/02 |
| | | | | 702/58 |

FOREIGN PATENT DOCUMENTS

| | | | | |
|---|---|---|---|---|
| CN | 202334002 U | * | 7/2012 | |
| CN | 102663535 A | | 9/2012 | |
| CN | 102981084 B | | 3/2013 | |
| CN | 103206984 A | | 7/2013 | |
| CN | 103678765 A | | 3/2014 | |
| CN | 203522212 U | | 4/2014 | |
| CN | 104931807 A | | 9/2015 | |
| EP | 3043437 A1 | * | 7/2016 | ............. H02H 3/334 |
| JP | 2016144297 A | * | 8/2016 | |
| WO | 2013/008246 A1 | | 1/2013 | |

OTHER PUBLICATIONS

European Search Report and Written Opinion issued in connection with corresponding EP Application No. 16168193.7 dated Sep. 16, 2016.

International Search Report and Written Opinion issued in connection with corresponding PCT Application No. PCT/US2017/015810, dated Apr. 13, 2017 (12 pages).

Office Action issued in Canadian Application No. 3,011,985, dated Apr. 30, 2019, 4 pages.

Office Action issued in Chinese Application No. 201780010313.7, dated Feb. 3, 2020, 7 pages.

Office Action issued in European Application No. 17 705 522.5, dated Aug. 8, 2019, 4 pages.

* cited by examiner

SYSTEMS AND METHODS FOR MONITORING AND DIAGNOSING TRANSFORMER HEALTH

RELATED APPLICATION

The present application claims priority to and is a Continuation-In-Part of U.S. patent application Ser. No. 14/703,533, filed May 4, 2015, titled "INTEGRATED TRANSFORMER HEALTH MONITORING ARCHITECTURE", and further claims priority to Indian Patent Application No. 201644003795, filed Feb. 3, 2016, and titled "SYSTEMS AND METHODS FOR MONITORING AND DIAGNOSING TRANSFORMER HEALTH," both of which are hereby incorporated by reference.

FIELD OF THE DISCLOSURE

This disclosure relates to transformers, and more particularly, to systems and methods for monitoring and diagnosing transformer health.

BACKGROUND OF THE DISCLOSURE

Various types of transformers are used in various types of applications. More particularly, power transformers are used ubiquitously in electrical power transmission systems to tailor voltage levels suitable for transmission over power lines. Such power transformers typically incorporate cooling mechanisms that are oil-based in order to dissipate heat generated in the transformer windings. However, over time, the chemical constituents of such oils tend to deteriorate and compromise transformer operations. For example, the viscosity of the oil in a power transformer may change over time and/or harmful gases may be released (for example as a result of a lightning strike) potentially leading to critical damage in the power transformer. Consequently, certain types of monitoring devices can be coupled to a power transformer in order to obtain gas samples from inside the transformer and to analyze these gas samples in order to evaluate the quality of the oil and to assess the health status of the power transformer.

The health status of the power transformer can be further monitored using other devices that detect various types of transformer faults and may take remedial action as well. For example, protection devices using sensors and relays may be used to monitor various currents and voltages associated with the power transformer and to isolate the power transformer from the power line for example, when a fault is detected in either the transformer itself or in the power line. One of the types of faults associated with a power transformer is known in the art as a through-fault. A typical through-fault can be characterized by a large amount of current propagating through the power transformer. When this current exceeds an operating current limit of the power transformer, the through-fault is deemed a major though-fault or as critical through-fault that necessitates immediate remedial action. For example, a short circuit in a load coupled to the power line, or a short circuit between the terminals of the power transformer, may necessitate immediate isolation of the power transformer from the power line. However, some other types of through-faults that occur in the power transformer can be more subtle in nature and comparatively harder to detect. For example, a current propagating through the power transformer may be below a trip limit of a protection device, yet significant enough to cause long-term damage to the power transformer if left unaddressed.

Consequently, certain types of transformer monitoring devices can be coupled to the power transformer in order to detect these types of subtle through-faults. These transformer monitoring devices can sense various types of transformer-related parameters (such as a primary winding current and a secondary winding current) in order to detect a through-fault based on small changes that can occur in one or more of these parameters. As can be understood, the amount of change in these various parameters can be very small and the effectiveness of various conventional transformer monitoring devices are often sub-optimal not only because they are unable to detect these small changes but also because of limitations in the algorithms and procedures used to process these subtle changes when detected.

Furthermore, conventional transformer monitoring devices are often configured to operate in an independent manner that focuses only on one primary function, such as detecting an electrical fault requiring immediate remedial action, detecting a through-fault requiring remedial action over a period of time, or analyzing a gas sample for detecting an oil-related issue in the transformer that is addressable over a period of time. Such conventional transformer monitoring devices fail to provide a holistic solution that addresses a combination of various factors that may interact with each other to adversely affect the health of a power transformer such as an oil-related gas buildup that may exacerbate a through-fault in the power transformer.

BRIEF DESCRIPTION OF THE DISCLOSURE

Embodiments of the disclosure are directed generally to systems and methods for monitoring and diagnosing transformer health, including the detection of through-faults and other types of faults associated with power transformers.

According to one exemplary embodiment of the disclosure, a system includes one or more electrical current sensing elements, a dissolved gas analysis (DGA) apparatus, and a diagnostic apparatus. The electrical current sensing elements and the DGA apparatus are coupled to the transformer and to the diagnostic apparatus. The diagnostic apparatus is configured to execute an electrical current flow analysis of the transformer based at least in part on electrical current values received from the electrical current sensing elements; to detect, based on the electrical current flow analysis, a through-fault condition; to receive DGA data from the DGA apparatus and to detect, based on the DGA data, an abnormal gas-related condition. The diagnostic apparatus is further configured to generate transformer health data based at least in part on the through-fault condition and the abnormal gas-related condition; and to transmit a transformer health related signal and/or a control signal based on the transformer health data.

According to another exemplary embodiment of the disclosure, a diagnostic apparatus includes a first input interface, a second input interface, and a third input interface. The first input interface is configured to receive a first monitor current that is proportional to a primary winding current of a transformer. The second input interface is configured to receive a second monitor current that is proportional to a secondary winding current of the transformer. The third input interface is configured to receive DGA data from a DGA apparatus. The diagnostic apparatus further includes one or more processors configured to execute an electrical current flow analysis of the transformer based at least in part on the first monitor current and the second monitor current; and to detect, based on the electrical current flow analysis, a through-fault condition. The one or more processors are further configured to detect from the received DGA data, an abnormal gas-related condition; and to generate transformer health data based at least in part on the through-fault condition and the abnormal gas-related condition. The diagnostic apparatus also includes an output interface that is configured to transmit from the diagnostic apparatus, a transformer health related signal and/or a control signal based on the transformer health data.

According to yet another exemplary embodiment of the disclosure, a method includes executing in a diagnostic apparatus, an electrical current flow analysis of a transformer. The electrical current flow analysis is based at least in part on a first monitor current that is proportional to a primary winding current of the transformer and a second monitor current that is proportional to a secondary winding current of the transformer. A through-fault condition can be detected based on the electrical current flow analysis. An abnormal gas-related condition in the transformer can be detected from dissolved gas analysis (DGA) data received from a DGA apparatus, and transformer health data can be generated based at least in part on the through-fault condition and the abnormal gas-related condition. A transformer health related signal and/or a control signal based on the transformer health data can then be transmitted.

Other embodiments and aspects of the disclosure will become apparent from the following description taken in conjunction with the following drawings.

BRIEF DESCRIPTION OF THE DRAWINGS

Figure 1:
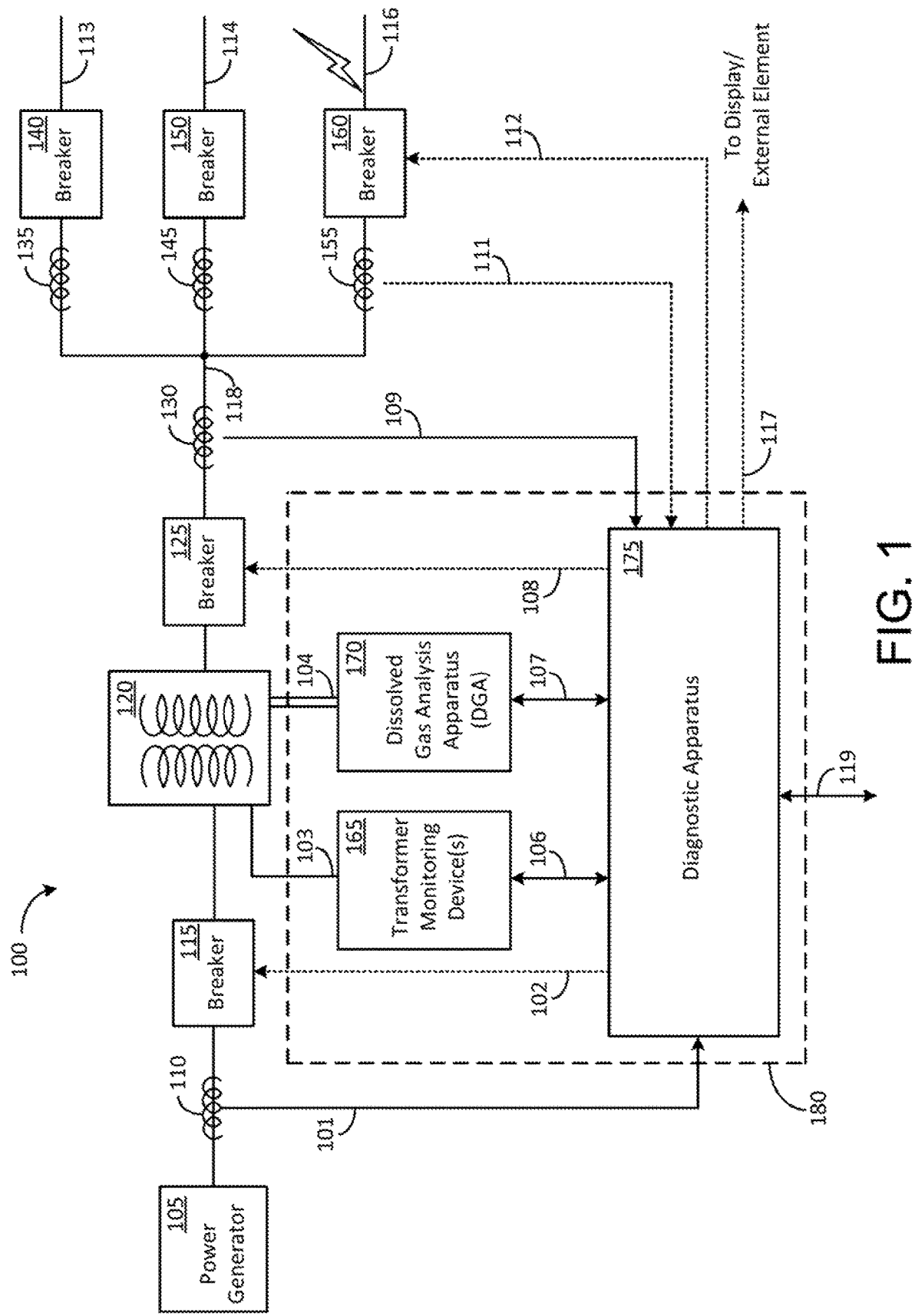

Having thus described the disclosure in general terms, reference will now be made to the accompanying drawings, which are not necessarily drawn to scale, and wherein:

FIG. 1 illustrates an example transformer health monitoring system that can include a diagnostic apparatus configured to monitor the health of a power transformer in accordance with an exemplary embodiment of the disclosure.

Figure 2:
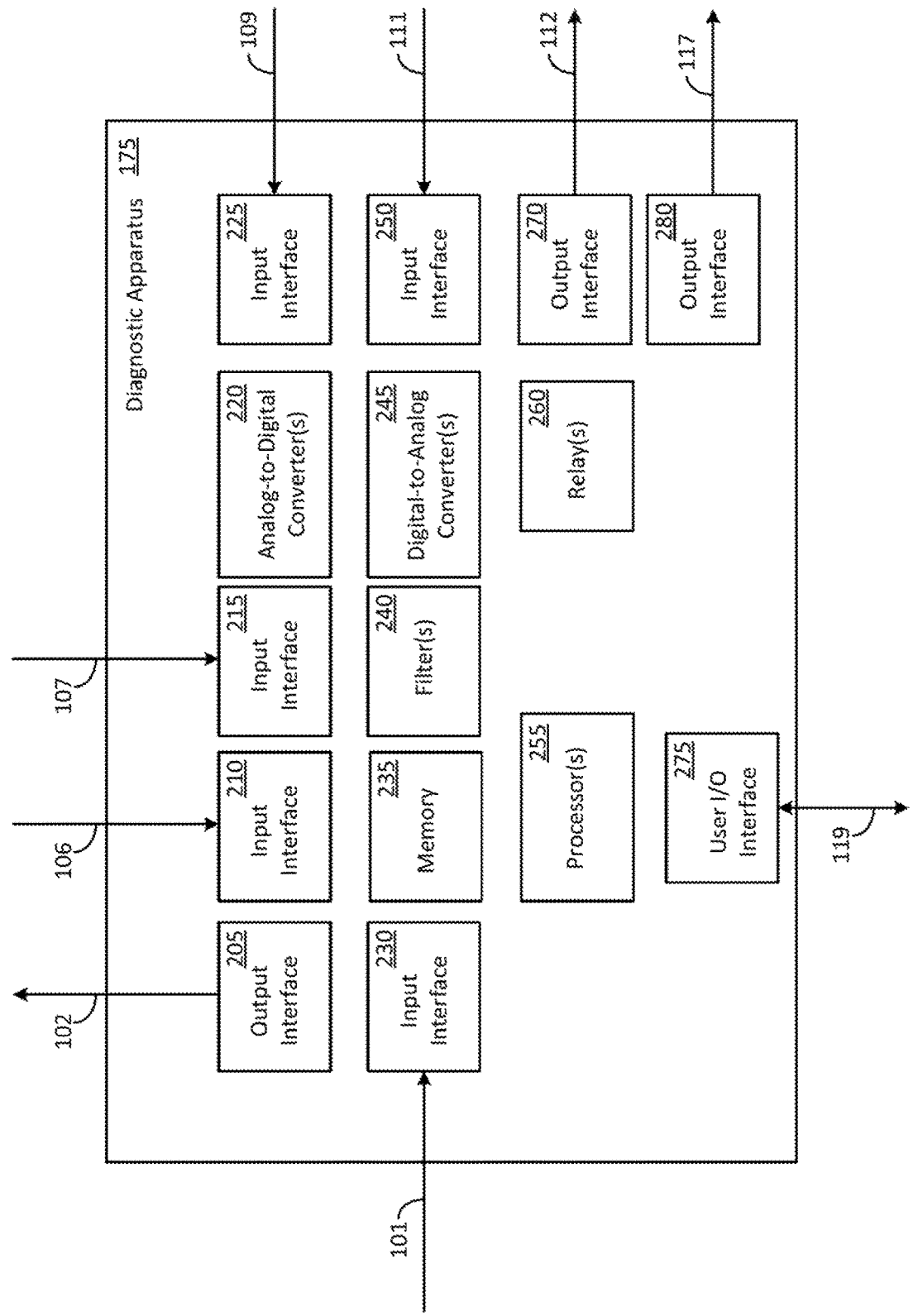

FIG. 2 illustrates an exemplary diagnostic apparatus in accordance with an exemplary embodiment of the disclosure.

Figure 3:
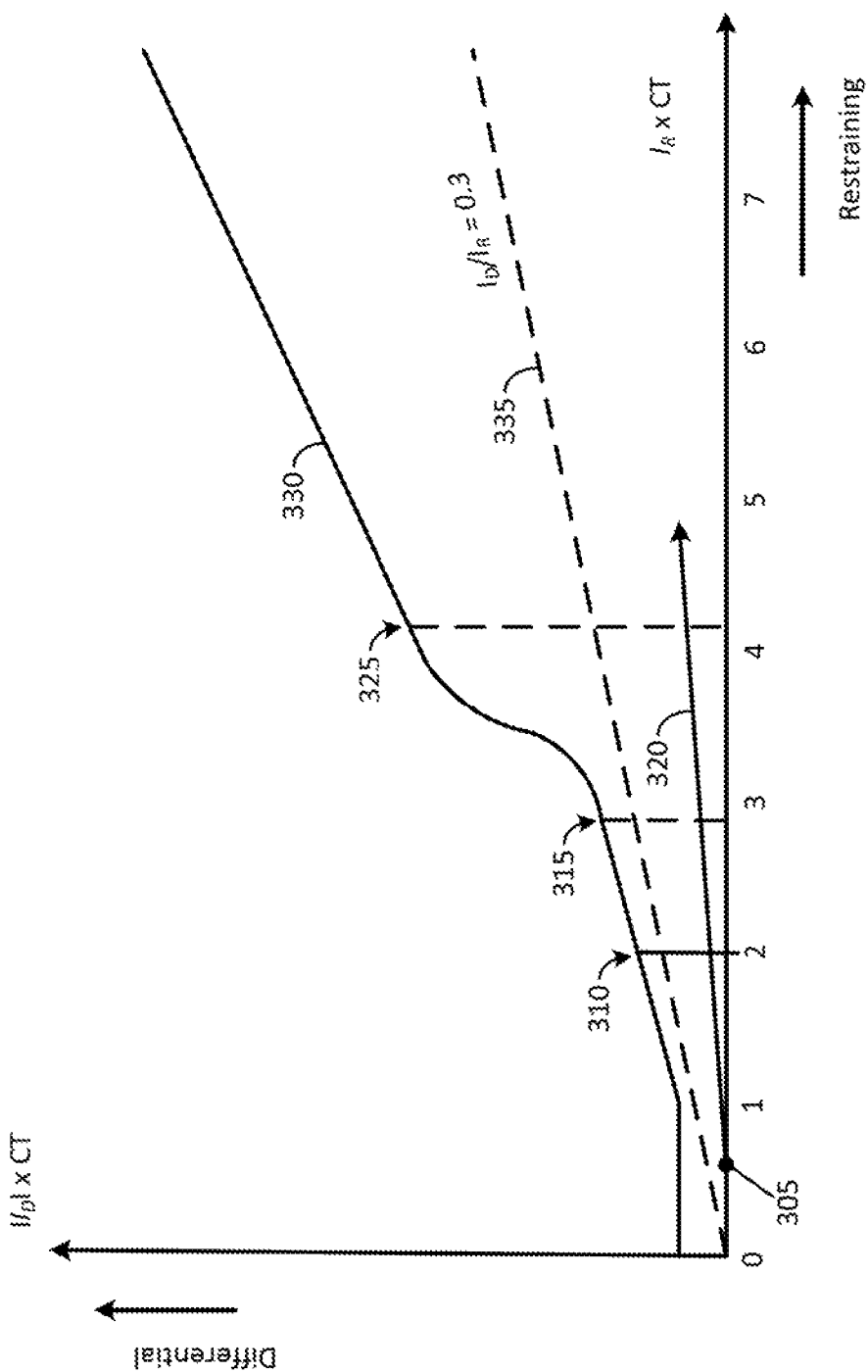

FIG. 3 illustrates a chart that indicates an example relationship between a restraining current and a differential current flow in a transformer that is used to detect a through-fault-fault in accordance with an exemplary embodiment of the disclosure.

Figure 4:
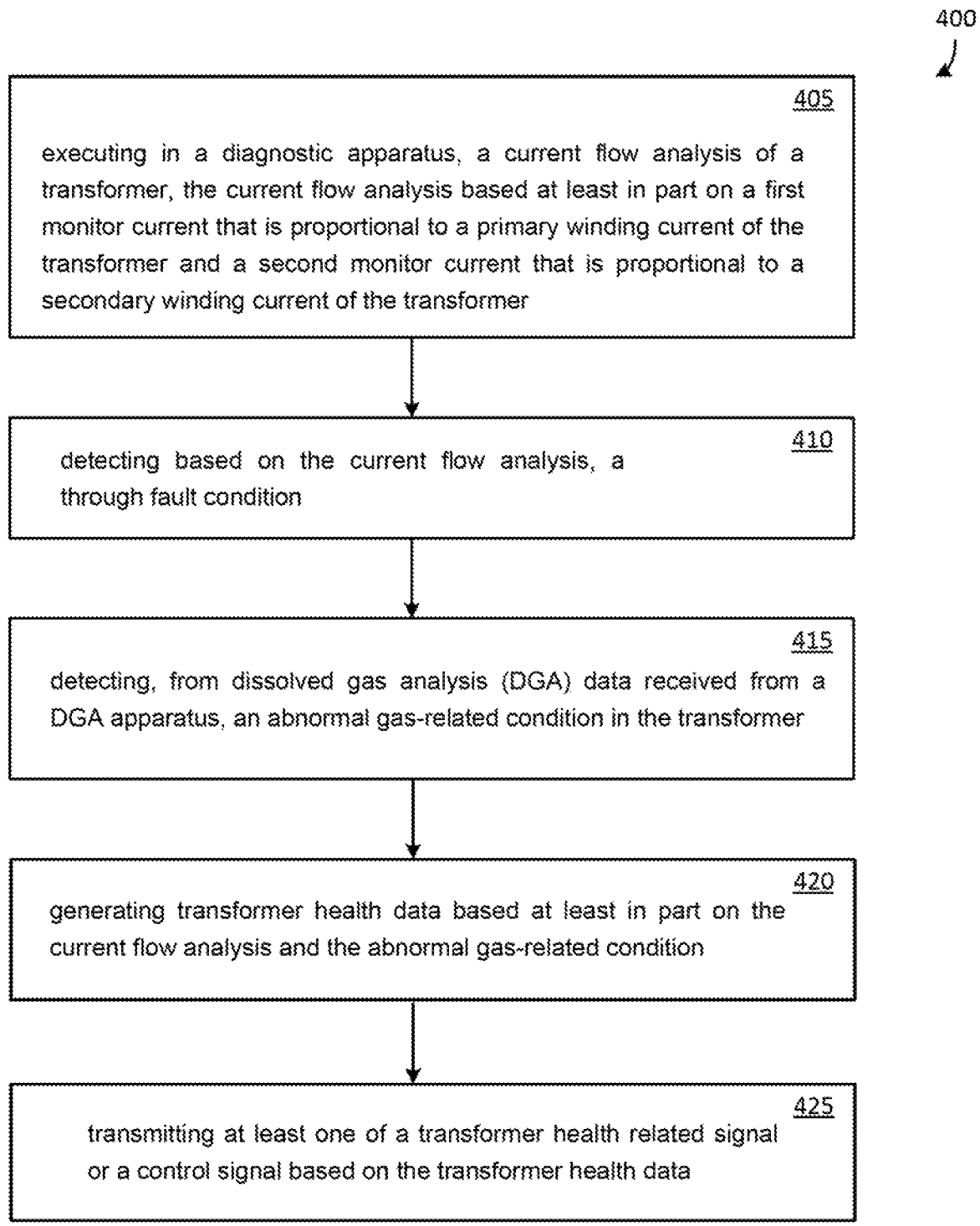

FIG. 4 shows a flowchart of an example method of using a diagnostic apparatus to detect a through-fault in a transformer in accordance with an exemplary embodiment of the disclosure.

DETAILED DESCRIPTION OF THE DISCLOSURE

The disclosure will be described more fully hereinafter with reference to the accompanying drawings, in which exemplary embodiments of the disclosure are shown. This disclosure may, however, be embodied in many different forms and should not be construed as limited to the exemplary embodiments set forth herein; rather, these embodiments are provided so that this disclosure will satisfy applicable legal requirements. Like numbers refer to like elements throughout. It should be understood that certain words and terms are used herein solely for convenience and such words and terms should be interpreted as referring to various objects and actions that are generally understood in various forms and equivalencies by persons of ordinary skill in the art. For example, it should be understood that the word "line" as used herein generally refers to an electrical conductor, for example, a wire or an electrical power cable. The word "breaker" as used herein is not limited to a circuit breaker but generally refers to various types of protection elements that can be activated in order to protect a faulty transformer or equipment connected to a faulty transformer. The word "current" as used herein generally refers to an electrical current. Furthermore, the word "example" as used herein is intended to be non exclusionary and non-limiting in nature. More particularly, the word "exemplary" as used herein indicates one among several examples, and it should be understood that no undue emphasis or preference is being directed to the particular example being described.

In terms of a general overview, certain embodiments of the systems and methods described herein include a diagnostic apparatus that can be used to monitor and diagnose the health of a power transformer, and to detect through-faults and other types of faults associated with the power transformer.

Attention is first drawn to FIG. 1, which illustrates an example transformer health monitoring system 100 that can include a diagnostic apparatus 175 configured to monitor the health of a power transformer 120 in accordance with an exemplary embodiment of the disclosure. The power transformer 120 can be a single phase power transformer in one exemplary implementation and a multi-phase power transformer (for example, a three-phase power transformer) in another exemplary implementation. The input side and output side terminals (not shown) of the power transformer 120 can be connected to a single power line or multiple power lines (for example, three power lines) accordingly. However, solely for purposes of convenience, the power transformer 120 that is shown in FIG. 1 is a single-phase power transformer and various aspects in accordance with the disclosure will be described hereinafter in the context of single-phase power transformer associated with a single-phase power system.

In this exemplary embodiment, a power generator 105, which can generally refer to an electric power generating station or any other kind of power source, can be coupled to the primary side of the power transformer 120 via a first current monitoring element 110 and a first breaker 115. The secondary side of the power transformer 120 can be coupled to as line 118 via a second breaker 125 and a second current monitoring element 130. Furthermore, in this exemplary embodiment, the line 118 can be coupled into three feeder lines 113, 114, and 116. Feeder line 113 can include a third current monitoring element 135 and a third breaker 140. Feeder line 114 can include a fourth current monitoring element 145 and a fourth breaker 150. Feeder line 116 can include a fifth current monitoring element 155 and a fifth breaker 160.

A transformer monitoring device 165 can be coupled to the power transformer 120 via a line 103 for monitoring various transformer elements such as bushings and winding coils, various operating conditions such as temperature and moisture; and events such as switching events when a line is coupled or decoupled from a primary winding and/or a secondary winding of the power transformer 120. The exemplary transformer monitoring device 165, which can include one or more of a bushing monitor, a partial discharge monitor, and an on-load tap changer (OLTC) monitor, provides various types of monitoring data to the diagnostic apparatus 175 via one or more lines, such as a line 106. In some implementations, the line 106 can be a bi-directional communication link whereby the diagnostic apparatus 175 can not only receive monitoring data from the transformer monitoring device 165 but also transmit control signals to the transformer monitoring device 165 for executing various functions.

A dissolved gas analysis (DGA) apparatus 170 ran be coupled to the power transformer 120 via a suitable interface, such as a gas line 104, for monitoring and analyzing any gas buildup inside the power transformer 120. When gas is present in the power transformer 120 (for example as a result of a lightning strike on the power transformer 120 and/or on equipment associated with the power transformer 120) the DGA apparatus 170 can execute one or more gas analysis procedures and provides DGA data to the diagnostic apparatus 175 via one or more lines, such as a line 107. The gas analysis procedures can include computing a DGA model, such as a Duval triangle. The DGA data can indicate to the diagnostic apparatus 175, an abnormal gas-related condition. In some implementations, the line 107 can be a bi-directional communication link whereby the diagnostic apparatus 175 can receive DGA data from the DGA apparatus 170, and, in some instances, also transmit control signals to the DGA apparatus 170 for executing various functions in the DGA apparatus 170.

In some exemplary implementations, the diagnostic apparatus 175, the transformer monitoring device 165, and the DGA apparatus 170 can be collectively located within an integrated enclosure 180. The integrated enclosure 180 can be as conventional enclosure that is used for housing conventional protection circuitry and as such, the diagnostic apparatus 175, the transformer monitoring device 165, and the DGA apparatus 170 in accordance with the disclosure can be used in some implementations to complement pre-existing conventional protection circuitry or to co-exist independently along with pre-existing conventional protection circuitry in a single enclosure.

The diagnostic apparatus 175 will be described below in further detail using other figures. However, in terms of a general overview, the diagnostic apparatus 175 is configured to generate health data of the power transformer 120 based on transformer-related information such as various voltages and currents present in the primary and secondary windings, equipment conditions (such as bushings and terminals), operating conditions (such as an abnormal temperature condition, and/or an abnormal OLTC operation), and DGA data. More particularly, in the exemplary embodiment shown in FIG. 1, the diagnostic apparatus 175 can receive primary winding current information from the first current monitoring element 110 via a line 101, and secondary winding current information from the second current monitoring element 139 via a line 109. The diagnostic apparatus 175 can further receive transformer operating conditions data from the transformer monitoring device 145 via the line 106, DGA data from the DGA apparatus 170 via the line 107, and electrical current information of one or more of the feeder line 113, the feeder line 114, and the feeder line 116 (via one or more lines that are generally referenced by the numeral 111).

The transformer health data generated in the diagnostic apparatus 175 can be transmitted by the diagnostic apparatus 175 in the form of one or more transformer health related signals and/or control signals to other elements such as a display unit (not shown) or an alarm unit (not shown) via a line 117, for example. Some examples of signals transmitted by the diagnostic apparatus 175 will be described below in further detail. The diagnostic apparatus 175 is also configured to allow a user (not shown) to communicate with the diagnostic apparatus 175 via a communications link 119 in order to provide the diagnostic apparatus 175 with various kinds of operating instructions and/or to access various types of information/data associated with the diagnostic apparatus 175.

FIG. 2 illustrates some exemplary elements that can be contained in the diagnostic apparatus 175 in accordance with an embodiment of the disclosure. For purposes of description, the diagnostic apparatus 175 shown in FIG. 2 contains various elements that can be used for implementing the exemplary diagnostic apparatus 175 shown in FIG. 1 and described above with respect to the power transformer 120. Accordingly, the various input lines and output lines are designated by the same reference numerals that are shown in FIG. 1. However, in other implementations, such as, for example, when using the diagnostic apparatus 175 to monitor a three-phase transformer, the quantity and the nature of various elements contained (or used) in the diagnostic apparatus 175 can be different in order to match fewer or more input and output lines, for example.

In this exemplary implementation, the diagnostic apparatus 175 can include a number of input interfaces that are configured to receive various kinds of input information and can include a number of output interfaces that are configured to transmit various kinds of signals such as control signals and transformer health signals. Among the exemplary input interfaces shown, a first input interface 230 can be configured to receive primary winding current information via the line 101 coupled to the first current monitoring element 110. The line 101 can be a wire or a cable, for example, and can carry an electrical current in analog form. The electrical current carried on line 101 can be a sealed-down version of a primary current propagating through the primary winding of the power transformer 120. A second input interface 225 can be configured to receive secondary winding current information via the line 109 from the second current monitoring element 130. The line 109 can be a wire or a cable, for example, that can carry an electrical current in analog form. The electrical current carried on line 109 can be a scaled-down version of the secondary current propagating through the secondary winding, of the power transformer 120. A third input interface 215 can be configured to receive DGA information from the DGA apparatus 170. The DGA information can be provided to the input interface 215 in the form of digital data over the line 107, which can be a digital communication link.

A fourth input interface 210 can be configured to receive data from the transformer monitoring device 165. The data can be provided to the input interface 210 in the form of digital data over the line 106, which can be a digital communication link, for example. A fifth input interface 250 can be configured to receive feeder current information via the line(s) 111 from one or more of the current monitoring elements 135, 145, and/or 155. The line(s) 111 can be a wire or a cable for example, that can carry an electrical current in analog form. The electrical current carried on line(s) 111 can be a sealed-down version of the current propagating through one or more of the feeder lines 113, 114, and 116.

The diagnostic apparatus 175 can also include one or more output interfaces such as a first output interface 205 that is shown coupled to the line 102 for purposes of transmitting a control signal to the breaker 115. Similarly, a second output interface (not shown) can be coupled to the line 108 for purposes of transmitting a control signal to the breaker 125. A third output interface 270 can be coupled to one or more lines (such as the line 112) for purposes of transmitting one or more control signal to one or more of the breakers 140, 150, and 160. A fourth output interface 280 can be coupled to the line 117 for purposes of transmitting one or more transformer health related signals and/or control signals from the diagnostic apparatus 175 to an external element such as a display or an alarm unit for example.

The diagnostic apparatus 175 can further include one or more analog-to-digital converters and digital-to-analog converters. For example, the analog-to-digital converter 220 can be used to convert a current measurement, provided by one of the input interfaces in an analog form into a digital current measurement value that can be processed by the processor 255. Conversely, the digital-to-analog converter 245 can be used to convert various types of digital information that can be provided by the processor 255 to the digital-to-analog converter 245, into an analog output signal that can be transmitted out of the diagnostic apparatus 175 via the output interface 280, for example. One or more relays, such as a relay 260, can be used for various types of switching purposes. For example, the relay 260 can be used to switch various currents and/or alarm signals when a through-fault occurs in the power transformer 120.

One or more processors, such as the processor 255, can be configured to communicatively cooperate with a memory 235. The processor 255 can be implemented and operated using appropriate hardware, software, firmware, or combinations thereof. Software or firmware implementations cart include computer-executable or machine-executable instructions written in any suitable programming language to perform the various functions described, in one embodiment, instructions associated with a function block language can be stored in the memory 235 and executed b the processor 255.

The memory 235 can be used to store program instructions that are loadable and executable by the processor 255, as well as to store dam generated during the execution of these programs. Depending on the configuration and type of the diagnostic apparatus 175, the memory 235 can be volatile (such as random access memory (RAM)) and/or non-volatile (such as read-only memory (ROM), flash memory, etc). In some embodiments, the memory devices can also include additional removable storage (not shown) and/or non-removable storage (not shown) including, but not limited to, magnetic storage, optical disks, and/or tape storage. The disk drives and their associated computer-readable media can provide non-volatile storage of computer-readable instructions, data structures, program modules, and ether data. In some implementations, the memory 235 can include multiple different types of memory, such as static random access memory (SRAM), dynamic random access memory (DRAM), or ROM.

The memory 235, the removable storage, and the non-removable storage are all examples of non-transient computer-readable storage media. Such non-transient computer-readable storage media can be implemented in any method or technology for storage of information such as computer-readable instructions, data structures, program modules or other data. Additional types of non-transient computer storage media that can be present include, but are not limited to, programmable random access memory (PRAM), SRAM, DRAM, ROM, electrically erasable programmable read-only memory (EEPROM), compact disc read-only memory (CD-ROM), digital versatile discs (DVD) or other optical storage, magnetic cassettes, magnetic tapes, magnetic disk storage or other magnetic storage devices, or any other medium which can be used to store the desired information and which can be accessed by the processor 255. Combinations of any of the above should also be included within the scope of non-transient computer-readable media.

Turning to the contents of the memory 235, the memory 235 can include, but is not limited to, an operating system (OS) and one or more application programs or services for implementing the features and aspects disclosed herein. Such applications or services can include a transformer health data generation module (not shown). In one embodiment, the transformer health data generation module can be implemented b software that is provided in configurable control block language and is stored in non-volatile memory. When executed by the processor 255, the transformer health data generation module can implement the various functionalities and features described, in this disclosure.

A few operational and applications aspects of the diagnostic apparatus 175 will now be described in more detail. In one example implementation, the diagnostic apparatus 175 can be used to sample and/or collect electrical data associated with the power transformer 120 either at predetermined intervals or continuously (e.g., in real time). As a part of the sampling procedure, retrieved electrical data can be assigned a time-stamp that corresponds to a moment in time at which the sampling of the electrical data occurred. After time-stamping, the electrical data can be stored in the memory 235 or in an offsite server, a cloud server, and/or the like (not shown) and accessed by the processor 255 for analysis purposes.

The processor 255 can analyze the stored electrical data to determine if and when an event has occurred with respect to the power transformer 120. For example, the processor 255 can analyze the electrical data to identify a maximum or minimum parameter value (e.g., a voltage) of the power transformer 120 that exceeds a predetermined allowable threshold. In this way, the processor 255 can recognize or otherwise detect an event, such as an abnormality in the electrical data, which may correlate to an operational malfunctioning of the power transformer 120. An event may also include one or more of a variety of circumstances with respect to the power transformer 120, including, but not limited to, a power failure, as mechanical failure, manual or automatic trip, an electrical failure, an operational fault, a power leak, a triggered alarm, a parameter that meets and/or exceeds a predetermined threshold, and/or the like.

The processor 255 can further generate a confidence score of the likelihood that an identified abnormality in electrical data is correlated to an operational failure of the power transformer 120. Furthermore, based at least in part on determining that an event has indeed occurred, the diagnostic apparatus 175 can transmit a command to one or more monitoring devices, such as the transformer monitoring device 165 and/or the DGA apparatus 179, to initiate sampling data from the power transformer 120.

The one or more monitoring devices can be used by the diagnostic apparatus 175 to retrieve and/or collect data (e.g., mechanical or electrical or signature data) pertaining to mechanical issues and/or health conditions of the power transformer 120. For example, the DGA apparatus 170 can be configured to retrieve data through analyses of gas particles of oil in the power transformer 120. Example analyses of gas particles of oil can include, but are not limited to, photoacoustic spectroscopy and gas chromatography. Different types of DGA apparatuses may be utilized for retrieving, different types of DGA data (e.g., based on particle size, oil type, and/or the like).

In some implementations, more than one DGA apparatus ma be used. Consequently, more computer processing and more data processing time (e.g., More computing power and analysis may be required to acquire DGA data than acquiring electrical health data of the power transformer 120. In such applications, the processor 255 may use or determine a time-stamp offset to be added to a time-stamp of at least one of a previously time-stamped electrical data or a previously acquired DGA data in this way, the diagnostic apparatus 175 can ensure that time-stamps of all received data (e.g., electrical data and DGA data) are accurately synchronized with respect to each other.

Furthermore, because obtaining DGA data from the power transformer 120 using more than one DGA apparatus can be a time-consuming process, a sampling routine can be scheduled in advance by the diagnostic apparatus 175. For example, the diagnostic apparatus 175 may determine whether any one of multiple DGA apparatuses is currently obtaining DGA data samples from the power transformer 120 (e.g., determine a state of the one or more DGA apparatus) by continuously for intermittently) monitoring the state(s) of one or more of the DGA apparatuses. If it is determined that a DGA apparatus is currently obtaining DGA data from the power transformer 120 (for example, by determining that the DGA apparatus is not in a standby mode of operation), then the diagnostic apparatus 175 may allocate the DGA apparatus a next available time-stamp. On the other hand, if it is determined that the DGA apparatus is not currently obtaining DGA data from the power transformer 120 (for example, by determining that the DGA apparatus is in a standby mode of operation), then the diagnostic apparatus 175 may prompt the DGA apparatus on standby to begin sampling immediately or to begin sampling at a predetermined instant in time later on.

The processor 255 can be further configured to recall and/or retrieve stored data (e.g., electrical data and DGA data) for one or more analyses. For example, in response to determining that an event has occurred with respect to the power transformer 120, the processor 255 may recall data that was time-stamped immediately prior to the time-stamp of the determined occurred event (e.g., electrical pre-data and DGA pre-data) and/or data that was time-stamped immediately after the time-stamp of the determined occurred event (e.g., electrical post-data and DGA post-data). In some embodiments, recalling pre-data and post-data may include determining a time-stamp of electrical data and DGA data stored in memory and identifying electrical data and DGA data stored in memory as electrical pre-data, electrical post-data DGA pre-data, and/or DGA post-data based at least in part on their respective time-stamps.

The processor 255 may analyze pre-data and post-data for a variety of purposes. For example, pre-data and post-data may be analyzed to determine as cause of the event that occurred with respect to the power transformer 120 or understand the amount of stress experienced h power transformer 120 due to the event. In this way, pre-data and post-data can be utilized to understand the status of the power transformer 120 immediately prior to and immediately after the occurrence of the event, as pre-data and post-data may be indicative of particular extreme parameters or other factors that contributed to occurrence of the event (for example, a failure). The processor 255 may also determine, based at least in part on an analysis of data (e.g., electrical data, DGA data, pre-data, and/or post-data) an event type.

In some embodiments, an analysis of data by the processor 255 may include comparing recently received electrical data and/or DGA data to historical data (e.g., historical electrical data and/or historical DGA data) stored in memory. In this manner, the processor 255 can be configured to compare recently received data to historical data that is indicative of an occurrence of a particular historical event with respect to the power transformer 120. Based at least in part on determining a match between the recently received data and historical data that is indicative of an occurrence of a historical event to the same power transformer 120 or another transformer, the processor 255 may determine that an event of the same event type as the historical event has recently occurred to the power transformer 120. A similar analysis may also be implemented by the processor 255 to determine an event type and/or event cause of a recently-occurred event.

Based at least in part on an analysis of data, the processor 255 can be configured to determine and/or predict a cause of an event determined to have occurred with respect to the power transformer 120. In some embodiments, the processor 255 can be further configured to predict a future event, a cause of a future event, and/or a type of a future event, such as a failure, of the power transformer 120. In response to predicting a future event of the power transformer 120, the processor 255 may generate and/or schedule a maintenance request to repair the power transformer 120, log it as an event in database, and raise alarm/caution/warning prior to an occurrence of the predicted future event. The diagnostic apparatus 175 may transmit maintenance or frequent monitoring requests via the line 117 to a maintenance server and/or designated authorized person or persons.

In some embodiments, analyzing data can include determining one or more parameters of the power transformer 120 (for example, art electrical parameter, a DGA-related parameter and/or the like) no longer complies with one or more regulatory standards and/or fault codes. In order to do this, the processor 255 may compare received and/or historic, data of the power transformer 120 to data associated with a transformer that does not comply with one or more regulatory standards and/or limit codes. Based at least in part on determining at least a partial match between the received and/or historic data of the power transformer 120 and data associated with a transformer that does not comply with one or more regulatory standards and/or fault codes, the processor 255 may determine that the power transformer 120 needs maintenance and/or replacement.

Additionally, the processor 255 can be configured to generate one or more reports based at least in part on an analysis of data. For example, the processor 255 may generate an energization record that highlights identified power and/or electrical issues of the power transformer 120 based at least in part on parameters associated with received electrical data such as a power failure, extreme fluctuations in current, and/or the like. Further DGA data captured during energization can be correlated with electrical data.

In another example, the processor 255 may generate a learned data record that includes actual received data of the power transformer 120 and to plot of the actual data. The processor 255 may, based at least in part on the analysis and/or plot of actual data, identify and/or predict one or more trends of transformer behavior.

In another embodiment, the processor 255 may generate a fault report that can include an analysis of stress levels incurred by the power transformer 120 prior to, during, and after occurrence of an event. A fault report may also include a determined change in parameter levels of the power transformer 120 between pre-data and post-data. The processor 255 may further determine a lifespan of the power transformer 120 based at least in part on an analysis of data and/or calculated data points such as a number of events (e.g., faults), their event types, a frequency of events, and/or the like incurred by the power transformer 120.

The processor 255 may also generate a historical max record. The processor 255 can be configured to compare each received data value (e.g., incoming electrical data and transformer health data) to a historical maximum value stored in memory of a similar data and/or parameter type. The processor 255 can determine which of the two data values is a maximum for a minimum, an average, and/or the like), and can assign a corresponding, maximum tag to the determined maximum. In this manner, the diagnostic apparatus 175 can keep track of (for example, by storing in the memory 235) extreme values for each parameter of the transformer along with a time stamp where so desired.

The processor 255 may also generate a transformer health report that can summarize an analysis of some or all data of the power transformer 120. The transformer health report may include some or all measured parameters of the power transformer 120 at each point in time, recommendations and/or status of maintenance and/or maintenance requests, and/or the like.

A transformer fleet report may also be generated by the processor 255. The transformer fleet report can include one or more transformer health reports for multiple transformers in a power system or utility grid. The transformer fleet report may also include a determined capacity of a power plant and/or geographic area of a power transmission & distribution system, identified events and/or problematic transformers, and/or the like.

Each of the reports and/or data itself may be transmitted to another computing device (not shown) for review, additional processing, and/or display. In some embodiments, data and/or reports may be presented to a user via a display on a mobile computing device and/or communication device. In other embodiments, data and/or reports may be generated and transmitted as a document, an email, a message, a tweet, a text, and/or the like. The data and/or reports may also be uploaded to a network-based server or a cloud based server so that they are accessible by one or more users. User authentication may be needed for accessing the data and/or reports.

The diagnostic apparatus 175 can be further configured to utilize the processor 255 to control operation of the power transformer 120. For example, if the diagnostic apparatus 175 determines, based at least in part on an analysis of data of the power transformer 120 that the power transformer 120 has experienced an event that includes a failure of a mechanical component(s) of the power transformer 120, then the diagnostic apparatus 175 may (in response to determining a particular event type) shut off operation or otherwise control operation of the power transformer 120 (via operating one or more breakers, such as the breaker 115, the breaker 125, and/or the breaker 160). In this context, attention is drawn to FIG. 1, which shows a lightning strike having occurred on the feeder line 116, which may have led to a malfunction in the power transformer 120 that is detected by the DGA apparatus 170 and communicated to the diagnostic apparatus 175. The diagnostic apparatus 175 then activates the breaker 160 to isolate the feeder line 116.

The diagnostic apparatus 175 may also be coupled to one or more power transformers in addition to the power transformer 120. In this manner, the diagnostic apparatus 175 may enable the communication, transmittal, receipt, and/or sharing of data between transformers and/or transformer control systems. In some embodiments, the diagnostic apparatus 175 can be configured to monitor one or more transformers, analyze data associated with a plurality of transformers, and/or control one or more transformers.

Attention is now drawn to FIG. 3, which shows a chart that indicates a relationship 330 between a restraining current and a differential current flow in a transformer, such as the power transformer 120. The relationship 330 shown in the chart can be used to detect a through-fault-fault in accordance with an exemplary embodiment of the disclosure. In a broad sense, a through-fault can be identified and declared when a small differential current (or no differential current) is detected to be co-existing with a high restraining current in the power transformer 120. Such an event can generally coincide with a saturation free time that occurs during the first few milliseconds after an inception of a fault in the power transformer 120.

The example chart shown in FIG. 3, graphically illustrates a trajectory 320 that resembles an example through-fault and current saturation in the power transformer 120. A directional principle is used to check if one or more currents with significant magnitudes (as compared with a fault current) flow in one direction (which is indicative of an internal fault in the power transformer 120) or one current flows in an opposite direction to a sum of other currents (which is indicative of a fault that is external to the power transformer 120). In accordance with an embodiment of the disclosure, the diagnostic apparatus 175 executes a procedure that continuously calculates per-phase differential and restraining current values and compares a ratio between a per-phase differential and a restraining current value against a user pre-defined differential/restraining characteristic. Such a procedure can be used to define a zone of differential protection operation and/or a zone of no operation and also to determine one or more set points relating to sensitivity, dependability, and security of the power transformer 120 under various types of faults. The set points can be programmed by an operator of the diagnostic apparatus 175 to reflect various transformer differential protection applications.

The differential current value can be calculated on a per-phase basis as a vector sum of currents from all winding of the power transformer 120 after magnitude and angle compensation is provided. This operation can be defined by the following equation:

$$Id = \bar{I}_{1_{comp}} + \bar{I}_{2_{comp}} + \bar{I}_{3_{comp}}$$

The restraining current value can be calculated as a maximum of internally compensated currents of the power transformer 120 and can be defined by the following equation:

$$Ir = \max(|\bar{I}_{1_{comp}}|, |\bar{I}_{2_{comp}}|, |\bar{I}_{3_{comp}}|)$$

An exemplary condition for declaring a through-fault detection condition based on percentage differential protection in accordance with the disclosure can be defined by the following equations:

$$Id/Ir < 0.3 \& Ir > 2 \times CT,$$

where CT represents at least one of a primary winding current value derived from the electrical current measurement obtained via the first current monitoring element 110 or a secondary winding current value derived, from the electrical current measurement obtained via the second current monitoring element 130.

The chart shown in FIG. 3 can be better described with respect to the example transformer health monitoring, system 100 shown in FIG. 1. During normal operation of the power transformer 120, a differential current value that can be calculated by the diagnostic apparatus 175 using the current measurements provided via the lines 101 and 109 has a low amplitude. However, when an external fault occurs (such as a lightning strike on the feeder line 116) the differential current value has a significantly higher amplitude. The differential current value as well as other measurements, such as a ratio between the differential current value and a restraining, current value, can be used by the diagnostic apparatus 175 for defining operate regions and block regions of one or more breakers, such as the breakers 115, 125, 140, 150, and 160.

Under normal loading conditions of the power transformer 120, the differential current value is substantially zero (as indicated by the dot 305). The restraining current value corresponding to the dot 305 is typically set to less than a current rating of the power transformer 120. When an external fault occurs, the trajectory 320 of the Id/Ir ratio always goes towards the right of an initial normal loading condition. Furthermore, in one example implementation, when the trajectory 320 indicates an Id/Ir ratio that is less than 0.3×CT rating and the restraining current is higher than 2×CT rating of the power transformer 120, a transformer through-fault flag 310 can be generated. In other example implementations, other values of the Id/Ir ratio and the restraining current can be used for generating the through-fault flag 310. For example, in lieu of the integers 0.3 and 2 that are used in the 0.3×CT rating and the 2×CT rating described above with reference to the first example implementation, other integers can be used. These other integers can be based on various sensitivity characteristics associated with a through-fault. When the through-fault flag 310 is generated, the diagnostic apparatus 175 can start obtaining pre-trigger and post-trigger data pertaining to the power transformer 120 as described above. The region of the trajectory 320 that is located between break-points 315 and 325 is indicative of a saturation-free period of operation of the power transformer 120.

Following the through-fault detection procedure described above with reference to FIGS. 1 and 3, the diagnostic apparatus 175 can execute various types of analysis procedures on not just the power transformer 120 but on associated components as well. Such associated components can include bushings and other fixtures for example. The analysis procedures can generally encompass monitoring of various thermal parameters, insulation parameters, bashing parameters, DGA parameters, load tap changes (LTCs), and protection integrity checks associated with one or more breakers.

Having described various features and actions associated with the exemplary transformer health monitoring system 100, and particularly the diagnostic apparatus 175, a general overview of various additional aspects in accordance with the disclosure will now be provided below.

In an example implementation, the diagnostic apparatus 175 can also be communicatively coupled to suitable oscillography apparatus for executing various types of oscillography procedures. For example, the diagnostic apparatus 175 can transmit it trigger signal to an oscillography apparatus upon detecting a through-fault in the power transformer 120. Oscillography data can then be captured at a "n" samples per cycle sampling rate where "n" is any suitable integer that is selected in order to capture data over "m" integer number of cycles. For example, a sampling rate of 50 samples per cycle or 60 samples per cycle can be used in some implementations.

Using such captured data from oscillography procedures, as well as other procedures, a statistical analysis of pre-fault and post-fault conditions can be carried out by the diagnostic apparatus 175. The statistical analysis can include calculation of various values pertaining to variance and deviations and comparison against threshold values.

In another example implementation, the diagnostic apparatus 175 can be configured to capture data associated with one or more bushings based on a sampling procedure for example, upon detection of a through-fault. The sampling procedure can include collection of pre-fault and post-fault data from the one or more bushings.

FIG. 4 shows a flowchart of an example method of using the diagnostic apparatus 175 to detect a through-fault in the power transformer 120, in accordance with an exemplary embodiment of the disclosure. In block 405, an electrical current flow analysis of the power transformer 120 is executed by the diagnostic apparatus 175. The electrical current flow analysis based at least in part on a first monitor current that is proportional to a primary winding current of the transformer and a second monitor current that is proportional to a secondary winding current of the transformer. As shown in FIG. 1, the first monitor current can be provided to the diagnostic apparatus 175 from the first current monitoring element 110 via the hue 101, and the second monitor current can be provided to the diagnostic apparatus 175 from the second current monitoring element 130 via the line 109. In block 410, a through-fault condition is detected based on the current flow analysis. In block 415, an abnormal gas-related condition in the power transformer 120 is detected by the diagnostic apparatus 175 using DGA data provided by the DGA apparatus 170. In block 420, transformer health data is generated based at least on the current flow analysis and the abnormal gas-related condition, in block 425, a transformer health related signal and/or a control signal is transmitted by the diagnostic apparatus 175 based on the transformer health data.

Many modifications and other embodiments of the example descriptions set forth herein to which these descriptions pertain will conic to mind having the benefit of the teachings presented in the foregoing descriptions and the associated drawings. Thus, it will be appreciated the disclosure may be embodied in many forms and should not be limited to the exemplary embodiments described above. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A system comprising:
   at least one electrical current sensing element coupled to a transformer;
   a first breaker coupled to one of a primary winding of the transformer or a secondary winding of the transformer;
   a dissolved gas analysis (DGA) apparatus coupled to the transformer; and
   a diagnostic apparatus coupled to the at least one electrical current sensing element and the DGA apparatus, the diagnostic apparatus comprising:
   a memory containing an application program for monitoring and diagnosing a transformer health status; and
   a processor configured to fetch the application program from the memory and execute the application program to at least:

obtain electrical data from the at least one electrical current sensing element and DGA data from the DGA apparatus;

apply a time stamp to each electrical data and each DGA data;

store each electrical data and each DGA data in the memory;

calculate, based on the electrical data, a differential electrical current value and a restraining electrical current value;

determine that a ratio of the differential electrical current value and the restraining electrical current value is less than a first threshold value;

detect, based on the ratio of the differential electrical current value and the restraining electrical current value is less than the first threshold value, a through-fault condition;

detect, based on the DGA data, an abnormal gas-related condition;

identify a DGA time stamp associated with the abnormal gas-related condition;

retrieve electrical data and DGA data that are stored prior to the DGA time stamp and stored after the DGA time stamp;

analyze the retrieved electrical data and DGA data to determine a status of the transformer prior to occurrence of the through-fault condition and after occurrence of the through-fault condition;

predict, based at least in part on the status of the transformer prior to occurrence of the through-fault condition and after occurrence of the through-fault condition, a failure of the transformer prior to the actual failure of the transformer; and tripping, based at least in part on the retrieved electrical data and DGA data, via a control signal to, the first breaker to protect the transformer based on detection of the through-fault condition by the diagnostic apparatus.

2. The system of claim 1, wherein the at least one electrical current sensing element comprises a first electrical current sensing element and a second electrical current sensing element, the first electrical current sensing element configured to provide, to the diagnostic apparatus, a primary winding current value of the transformer and the second electrical current sensing element configured to provide, to the diagnostic apparatus, a secondary winding current value of the transformer.

3. The system of claim 1, further comprising at least one of a bushing monitor, a partial discharge monitor, or an on-load tap changer (OLTC) monitor coupled to the diagnostic apparatus, the diagnostic apparatus further configured to generate transformer health data based at least in part on event data received from the at least one of the bushing monitor, the partial discharge monitor, or the OLTC monitor.

4. The system of claim 1, further comprising a plurality of feeders coupled to the secondary winding of the transformer, wherein at least a second feeder among the plurality of feeders is in a non-fault condition when the through-fault condition occurs in a first feeder of the plurality of feeders.

5. The system of claim 1, wherein the processor is further configured to transmit a transformer health related signal based on transformer health data, the transformer health related signal comprising at least one of an out-of-specification warning signal that indicates that the transformer no longer complies with one or more regulatory standards, a degradation warning signal indicative of a reduced lifespan of the transformer, or an early warning signal indicative of at least one of a cause or a characteristic of a future failure of the transformer.

6. The system of claim 1, wherein the diagnostic apparatus is further configured to:

receive event data from a protection relay;

generate a record based at least in part on the event data received from the protection relay and the DGA data received from the DGA apparatus; and output, at least a portion of the record, via at least one of a user interface or a communication link of the diagnostic apparatus.

7. The system of claim 1, wherein detect a through-fault condition is further based on the restraining electrical current value being greater than a second threshold value.

8. A diagnostic apparatus comprising:

a first input interface configured to receive a first monitor current that is proportional to a primary winding current of a transformer;

a second input interface configured to receive a second monitor current that is proportional to a secondary winding current of the transformer;

a third input interface configured to receive DGA data from a DGA apparatus; and at least one processor configured to:
calculate, based on the first monitor current and the second monitor current, a differential electrical current value and a restraining electrical current value;

determine that a ratio of the differential electrical current value and the restraining electrical current value is less than a first threshold value;

detect, based on the ratio of the differential electrical current value and the restraining electrical current value is less than the first threshold value, a through-fault condition;

detect from the received DGA data, an abnormal gas-related condition;

identify a DGA time stamp associated with the abnormal gas-related condition;

retrieve electrical data and DGA data stored prior to the DGA time stamp or stored after the DGA time stamp;

analyze the retrieved electrical data and DGA data to at least determine an amount of stress experienced by the transformer due to the through-fault condition;

predict, based at least in part on a status of the transformer prior to occurrence of the through-fault condition and after occurrence of the through-fault condition, a failure of the transformer prior to the actual failure of the transformer; and trip, based at least in part on the retrieved electrical data and DGA data, via a control signal, a first breaker to protect the transformer based on detection of the through-fault condition by the diagnostic apparatus.

9. The diagnostic apparatus of claim 8, further comprising:

identifying a first instant in time at which the ratio is less than the first threshold and the restraining current value exceeds a second threshold value;

fetching from a storage element, historical electrical current flow data of the transformer;

generating cumulative electrical current flow data of the transformer by combining the historical electrical current flow data and real-time electrical current flow data obtained at the first instant in time and subsequent to the first instant in time; and detecting the through-fault condition based on the cumulative electrical current flow data of the transformer.

10. The diagnostic apparatus of claim 9, further comprising:
a protection relay configured to receive the control signal for transmission to either the first breaker or a second breaker, and modify or eliminate electrical current flow through at least one of a primary winding of the transformer or a secondary winding of the transformer.

11. The diagnostic apparatus of claim 9, wherein at least the first input interface, the second input interface, the third input interface, the at least one processor, and the storage element are collectively housed in an enclosure.

12. The diagnostic apparatus of claim 11, wherein the enclosure includes at least one of a communications port or a user interface that allows a user to set the first threshold value.

13. The diagnostic apparatus of claim 8, wherein the first monitor current is provided to the first input interface by a first electrical current transformer coupled in series with a primary winding of the transformer and the second monitor current is provided to the second input interface by a second electrical current transformer coupled in series with a secondary winding of the transformer.

14. A method comprising:
analyzing in a diagnostic apparatus, an electrical current flow of a transformer based at least in part on a first monitor current that is proportional to a primary winding current of the transformer and a second monitor current that is proportional to a secondary winding current of the transformer;
calculating, based on the electrical current flow, a differential electrical current value and a restraining electrical current value;
determining that a ratio of the differential electrical current value and the restraining electrical current value is less than a first threshold value;
detecting, based on the ratio of the differential electrical current value and the restraining electrical current value is less than the first threshold value, a through-fault condition;
detecting, based on the DGA data, an abnormal gas-related condition;
detecting, from dissolved gas analysis (DGA) data received from a DGA apparatus, an abnormal gas-related condition in the transformer;
identifying a DGA time stamp associated with the abnormal gas-related condition;
retrieving electrical data and DGA data that is stored prior to the DGA time stamp or stored after the DGA time stamp;
analyzing the retrieved electrical data and DGA data to at least determine an amount of stress experienced by the transformed due to the through-fault condition;
predict, based at least in part on a status of the transformer prior to occurrence of the through-fault condition and after occurrence of the through-fault condition, a failure of the transformer prior to the actual failure of the transformer; and
tripping, based at least in part on the retrieved electrical data and DGA data, via a control signal, a first breaker to protect the transformer based on detection of the through-fault condition by the diagnostic apparatus.

15. The diagnostic apparatus of claim 14, further comprising:
identifying a first instant in time at which the ratio is less than the first threshold and the restraining current value exceeds a second threshold value;
fetching from a storage element, historical electrical current flow data of the transformer; and
generating cumulative electrical current flow data of the transformer by combining the historical electrical current flow data and real-time electrical current flow data obtained at the first instant in time and subsequent to the first instant in time.

16. The method of claim 15, wherein the historical electrical current flow data is time-stamped, and wherein fetching the historical electrical current flow data is based at least in part on a definable period of time prior to the first instant in time.

17. The method of claim 16, further comprising:
receiving in the diagnostic apparatus, a user input comprising at least one of the first threshold value, or a time period specifying the definable period of time.

18. The method of claim 15, further comprising:
displaying on a display of the diagnostic apparatus, at least one of a transformer health status, the first instant in time at which the ratio is less than the first threshold and the restraining current value exceeds a second threshold value, or at least a portion of the cumulative electrical current flow data.

19. The method of claim 14, wherein DGA data received from the DGA apparatus comprises at least one of DGA data collected by the DGA apparatus prior to a first instant in time or DGA data collected by the DGA apparatus after the first instant in time.

20. The method of claim 19, wherein the DGA data collected by the DGA apparatus after the first instant in time is indicative of the transformer having at least one of a reduced performance, a compromised performance, a reduced lifespan, or an upcoming catastrophic failure.

* * * * *